US005670788A

United States Patent [19]

Geis

[11] Patent Number: 5,670,788

[45] Date of Patent: Sep. 23, 1997

[54] DIAMOND COLD CATHODE

[75] Inventor: Michael W. Geis, Acton, Mass.

[73] Assignee: Massachusetts Institute of Technology, Cambridge, Mass.

[21] Appl. No.: 823,989

[22] Filed: Jan. 22, 1992

[51] Int. Cl.$^6$ .............................. H01L 29/06; H01L 29/12

[52] U.S. Cl. .............................................. 257/10; 257/77

[58] Field of Search .................................. 257/10, 11, 77

[56] References Cited

U.S. PATENT DOCUMENTS

| | | | |
|---|---|---|---|
| 4,486,286 | 12/1984 | Lewin et al. | 204/192 |
| 4,506,284 | 3/1985 | Shannon | 357/52 |
| 4,513,308 | 4/1985 | Greene et al. | 357/55 |
| 4,571,447 | 2/1986 | Prins | 136/252 |
| 5,202,571 | 4/1993 | Hirabayashi et al. | 257/10 |

OTHER PUBLICATIONS

Geis et al., Diamond Cold Cathode, Aug. 1991, IEEE Electron Device Letters, vol. 12 No. 8.

Bajic and Latham, "Enhanced cold–cathode emission using composite resin–carbon coatings," J.Phys. D: appl. Phys. 21 10 (1988), pp. 200–204.

Geis, Smith, Argoitia, Angus, Ma, Glass, Butler, Robinson and Pryor, "Large–area mosaic diamond films approaching single–crystal quality," Appl. Phys. Lett. 58 (22), 3 Jun. 1991, pp. 2485–2487.

*Primary Examiner*—Sara W. Crane
*Attorney, Agent, or Firm*—Fish & Richardson P.C.

[57] ABSTRACT

A cold cathode device is provided comprising a wide-bandgap (>5 eV) material exhibiting negative electron affinities, low trap densities, and high carrier mobilities, a junction between a first region of the wide-bandgap material having n-type conductivity and a second region of the wide-bandgap material having p-type conductivity, and a conductive contact to forward bias the junction causing electrons to be emitted near the junction into an exterior region.

24 Claims, 2 Drawing Sheets

DIAMOND COLD CATHODE

The invention relates to cold cathodes for emitting electrons into a vacuum.

Robust, high-current-density (>1000 A $cm^{-2}$) cathodes while difficult to make are desirable for application in high-power, high-frequency devices.

A first prior art approach for fabricating these cathodes uses high electric fields produced at sharp edges or tips to cause electrons to tunnel out of a metal into vacuum (as described by Spindt et al., "Field-emission arrays for vacuum microelectronics," in *Proc. 3rd Int. Conf. Vacuum Microelectronics,* C. A. Spindt and H. F. Gray, Eds., New York: IEEE, 1991; Thomas et al., "Fabrication and some applications of large-area silicon field emission arrays," *Solid-State Electron.*, vol. 17, pp. 155–163, 1974; and Gray et al., "A silicon field emitted array planar vacuum FET fabricated with microfabrication techniques," in *Science and Technology of Microfabrication*, R. E. Howard, E. L. Hu, S. Namba, and S. W. Pang, Eds., Pittsburg, Pa.: Materials Research Society, 1987, pp. 23–30). However, as noted by Spindt et al., at high current densities these electric-field-assisted cathodes are unreliable and prone to catastrophic failure.

A second approach for fabricating these cathodes uses conventional semiconductors, such as Si (as in Martinelli et al., "The application of semiconductors with negative electron affinity surface to electron emission devices," *Proc. IEEE*, vol. 62, pp. 1339–1360, 1974), GaAs (as in Scheer et al., "GaAs-Cs: A new type of photoemitter," *Solid State Commun.,* vol. 3, pp. 189–193, 1965), or some organic crown ethers (as in Dye, "Electrides: Ionic salts with electrons as the anions," *Science*, vol. 247, pp. 663–668, 1990), with metals like K or Cs to produce a material whose conduction band is either above or very close to the vacuum energy level. With appropriate biasing of n-p junctions in the semiconductor, electrons can be ejected from the conduction band into vacuum (as described in Kohn, "Cold-cathode electron emission from silicon," *Appl. Phys. Lett.*, vol. 18, pp. 272–273, 1971; and Gorkom et al., "Performance of silicon cold cathodes," *J. Vac. Sci. Technol. B*, vol. 4, pp. 108–111, 1986). Although, as noted by Gorkom et al., such devices can emit very high current densities (>1500 A $cm^{-2}$), Gorkom et al. note further that such devices are easily contaminated and will not operate after exposure to $O_2$.

A third approach uses wide-bandgap (>5 eV) materials, including MgO (as in Aboelfotoh et al., "Influence of secondary-electron emission from MgO surfaces on voltage-breakdown curves in Penning mixtures of insulated-electrode discharges," *J. Appl. Phys.*, vol. 48, pp. 4754–4759, 1977), $SiO_2$ (as in Williams, "Photoemission of electrons from silicon and gold into silicon dioxide," *Phys. Rev.,* vol. 144, pp. 588–593, 1966), or diamond (as in Himpsel et al., "Quantum photoyield of diamond (111)—A stable negative-affinity surface," *Phys. Rev. B,* vol. 20, pp. 624–627, 1979; Pate et al., "The diamond (111) surface: A dilemma resolved," *Physica B,* vols. 117–118, pp. 783–785, 1983; and Geis et al., "Capacitance-voltage measurements on metal-$SiO_2$-diamond structures fabricated with (100)- and (111)-oriented substrates," in *IEEE Trans. Electron Devices,* March 1991), that have their conduction band within 1 eV of the vacuum energy level, even in the presence of $O_2$ and $H_2O$. Most of these materials are unacceptable for high-current-density cathodes, since they are insulators owing to low charge-carrier concentrations, low mobilities, and high trap densities. However, diamond can be doped either n- or p-type (as in Okano et al., "Synthesis of n-type semiconducting diamond film using diphosphorus pentoxide as the doping source," in *Appl. Phys. A,* vol. 51, pp. 1731–1733, 1991; and Geis, "Growth of device-quality homoepitaxial diamond thin films," in *Diamond, SiC, and Related Wide Bandgap Semiconductors,* vol. 162, J. T. Glass, R. Messier, and N. Fujimori, Eds., Pittsburg, Pa.: Material Research Society, 1990, pp. 15–22) and grown with sufficient quality to have low trap densities and high carrier mobilities, making it a semiconductor instead of an insulator, as noted by Geis.

Reference is also made to a paper of Bajic and Latham entitled "Enhanced cold-cathode emission using composite resin-carbon coatings" in J.Phys. D: appl. Phys. 21 (1988) 200–204 and a paper of Geis, Smith, Argoitia, Angus, Ma, Glass, Butler, Robinson and Pryor entitled "Large-area mosaic diamond films approaching single-crystal quality" in Appl. Phys. Lett. 58 (22), 3 Jun. 1991, 2485–87.

The present invention provides cold cathodes that are not adversely effected by standard semiconductor processing and do not have catastrophic failures. Therefore, devices embodying the invention can be used as cathodes in useful micron-sized, high-power, high-frequency vacuum devices. Devices embodying the invention may be used in place of conventional high-power vacuum tubes, pressure gauges, and other systems where hot filaments traditionally are used to generate free electrons.

In general, in one aspect, the invention features a cold cathode device, and a method for making the same, comprising a wide-bandgap (>5 eV) material exhibiting negative electron affinities, low trap densities, and high carrier mobilities, a junction between a first region of the wide-bandgap material having n-type conductivity and a second region of the wide-bandgap material having p-type conductivity, and a conductive contact to forward bias the junction causing electrons to be emitted near the junction into an exterior region.

In particular embodiments, the wide-bandgap material is diamond, the first region having n-type conductivity is carbon ion implanted diamond, the carbon ion implanted diamond is formed by carbon ion implantation into a diamond substrate heated to at least 320° C., and the carbon ion implantation is effected using a carbon ion current density of about $10^{-5}$ A $cm^{-2}$, with ion energies in the range of about 50 keV to about 170 keV, and fluences in the range of about $3.0\times10^{16}$ $cm^{-2}$ to about $3.8\times10^{16}$ $cm^{-2}$.

In still other particular embodiments, the second region having p-type conductivity is doped homoepitaxial diamond, the doped homoepitaxial diamond is formed by chemical vapor deposition with boron concentrations up to $10^{19}$ $cm^{-3}$, and the second region is less than about 1 μm thick.

In yet other particular embodiments, the conductive contact is formed from aluminum.

Preferably, a surface area of the second region exposed to the exterior region is substantially equal to the area of the junction between the first region and the second region.

In some embodiments, the exterior region includes less than about $1\times10^{-2}$ Torr of $O_2$, while in other embodiments the exterior region is an ultrahigh-vacuum of less than about $1\times10^{-5}$ Torr.

Some additional specific features of the invention include activating the emitting surface to increase emitted electron current with a gaseous treatment, such as with one or both of $O_2$ and $H_2O$, with a gaseous plasma or a plasma containing O, H, or OH atoms or molecules.

A feature includes a cold cathode by electron emission from n-type semiconductor (diamond) with electric fields less than $10^6$ V $cm^{-1}$ (without p-type material or a diode in the semiconductor).

A feature resides in using sharp points etched in the semiconductor (diamond) to increase electron emission at low average electric fields. A feature resides in using ion beam assisted etching to form the sharp points in the diamond.

A feature resides in a cathode where the material is diamond, and more specifically, where the emitting surface is (111)-orientation of diamond.

A feature resides in the formation of n-type diamond using phosphorous doping.

These and other objects, uses, and advantages of the invention will be apparent to those skilled in the art from the following detailed description when read in connection with the accompanying drawings wherein like reference numerals designate like parts and wherein.

Figure 1:
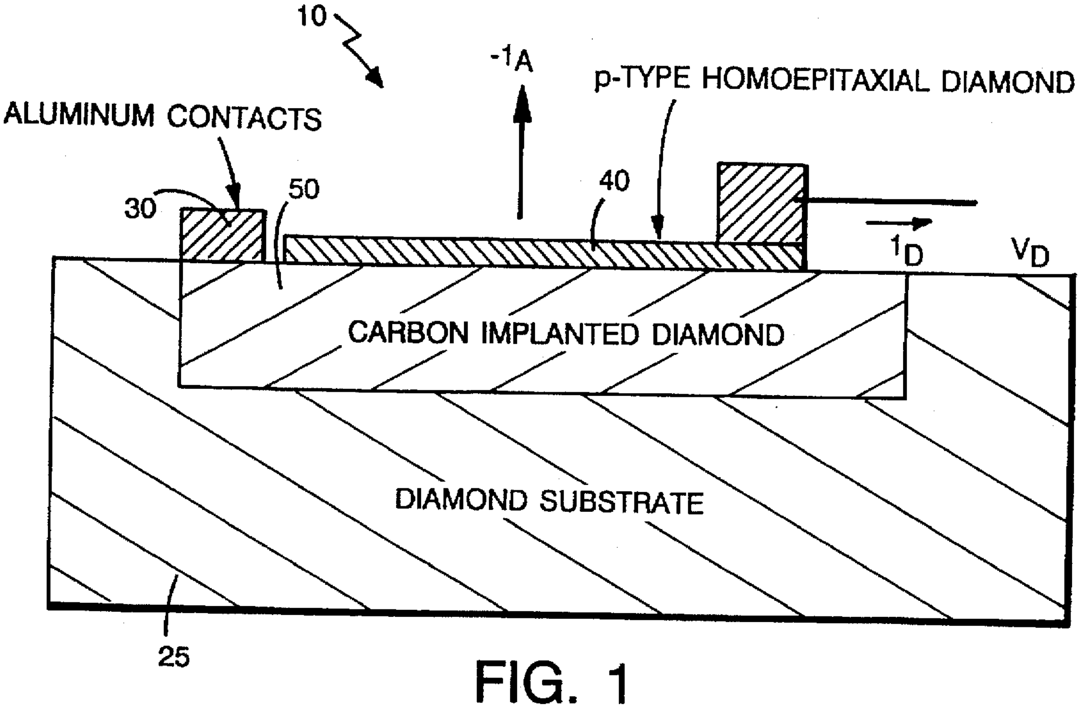
FIG. 1 depicts a schematic drawing of a high current density diamond cold cathode.

An exemplary embodiment of the present invention is a diamond cold cathode, indicated generally by 10 in FIG. 1, produced by forming diodes in diamond using carbon ion implantation into heated (320° C.) substrates 25, as described by Prins, "Bipolar transistor action in ion implanted diamond," *Appl. Phys. Lett.*, vol. 41, pp. 950–952, 1982. A current density of $10^{-5}$ A $cm^{-2}$ is used, with ion energies of 50, 106, or 170 keV and ion fluences of $3.8\times10^{16}$, $3\times10^{16}$, or $3.5\times10^{16}$ $cm^{-2}$, respectively. The region of carbon-implanted semiconducting diamond 50 exhibits n-type conductivity. A thin-film layer of p-type homoepitaxial diamond 40 is then deposited on the carbon-implanted diamond layer 50 using chemical-vapor-deposition with estimated boron concentrations of $10^{19}$ $cm^{-3}$, as described in Geis, "Growth of device-quality homoepitaxial diamond thin films," in *Diamond, SiC, and Related Wide Bandgap Semiconductors,* vol. 162, J. T. Glass, R. Messier, and N. Fujimori, Eds., Pittsburg, Pa.: Material Research Society, 1990, pp. 15–22. The carbon-implanted diamond layer 50 and homoepitaxial diamond thin-film layer 40 are then provided with conductive aluminum contacts 30. These contacts 30 may, for example, be fabricated by coating the carbon-implanted diamond layer 50 and homoepitaxial diamond thin-film layer 40 with of the order of 1 μm of electron-beam-evaporated Al, subsequently patterned as desired using standard photolithography.

When the diamond cold cathode 10 so constructed is forward biased by applying the appropriate potential $V_D$ to the conductive aluminum contacts 30, electrons are injected into the p-type homoepitaxial diamond thin-film region 40 from the n-type carbon-implanted diamond region 50. Once the electrons are in the p-type homoepitaxial diamond thin-film region 40 they can be emitted into the exterior vacuum, as indicated by the large arrow $-I_A$, adopting the usual convention in physics that positive currents I correspond to the movement of positive charges. High current densities and high current efficiencies (emitted current divided by diode current, $I_D$) are obtained by using large diode currents $I_D$, efficient cathode geometries optimizing emission surface area of the p-type homoepitaxial diamond thin-film region 40 of thickness less than about 1 μm (the minority carrier diffusion length), and ultrahigh-vacuum environments.

Figure 2:
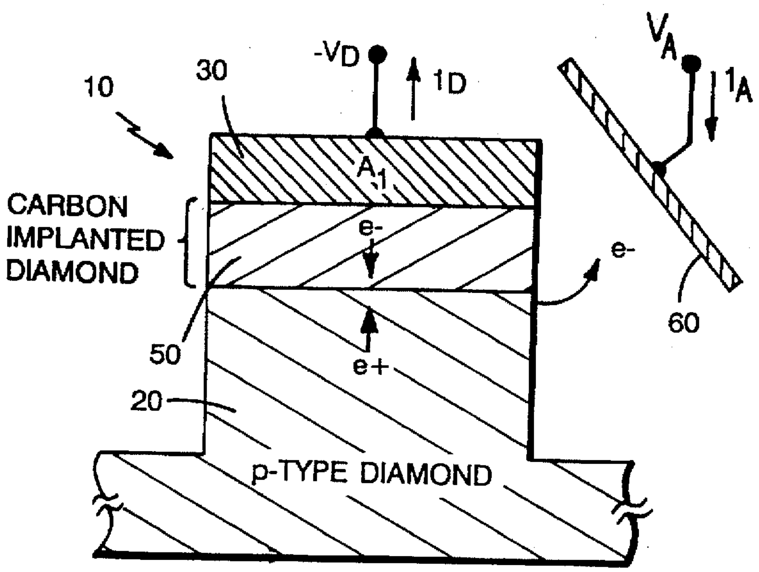
FIG. 2 depicts a schematic drawing of an experimental diamond cold cathode.

An experimental embodiment of the present invention is a diamond cold cathode, indicated generally by 10 in FIG. 2, produced by forming diodes in p-type semiconducting diamond using carbon ion implantation into heated (320° C.) substrates 20, as described by Prins, "Bipolar transistor action in ion implanted diamond," *Appl. Phys. Lett.*, vol. 41, pp. 950–952, 1982. A current density of $10^{-5}$ A $cm^{-2}$ is used, with ion energies of 50, 106, or 170 keV and ion fluences of $3.8\times10^{16}$, $3\times10^{16}$, or $3.5\times10^{16}$ $cm^{-2}$, respectively. The substrate 20 is then coated with 1 μm of electron-beam-evaporated Al, patterned into 60×60 $\mu m^2$ squares 30 on 100 μm centers using standard photolithography. The resistance between Al squares 30 and to the p-type substrate 20 is in the range of about $10^2$ to about $10^3$ Ω and is ohmic in character. The coated, patterned substrate is then etched to a depth of 1.1 μm with ion-beam-assisted etching (as in Efremow et al., "Ion-beam-assisted etching of diamond," *J. Vac. Sci. Technol. B*, vol. 3, pp. 416–418, 1985), using the Al squares 30 as a mask to form mesa structures 10 comprising a conductive contact layer of Al 30, a region of carbon-implanted diamond 50 having n-type conductivity, and a region of substrate 20 having p-type conductivity. After etching, diamond cold cathode structures 10 constructed in this manner exhibit diode character to the p-type substrate 20 with breakdown voltages of 400 to 600 V. The structures 10 are then mounted in either indium or silver-doped epoxy, cleaned in an oxygen plasma, and rinsed in water and acetone.

Figure 3:
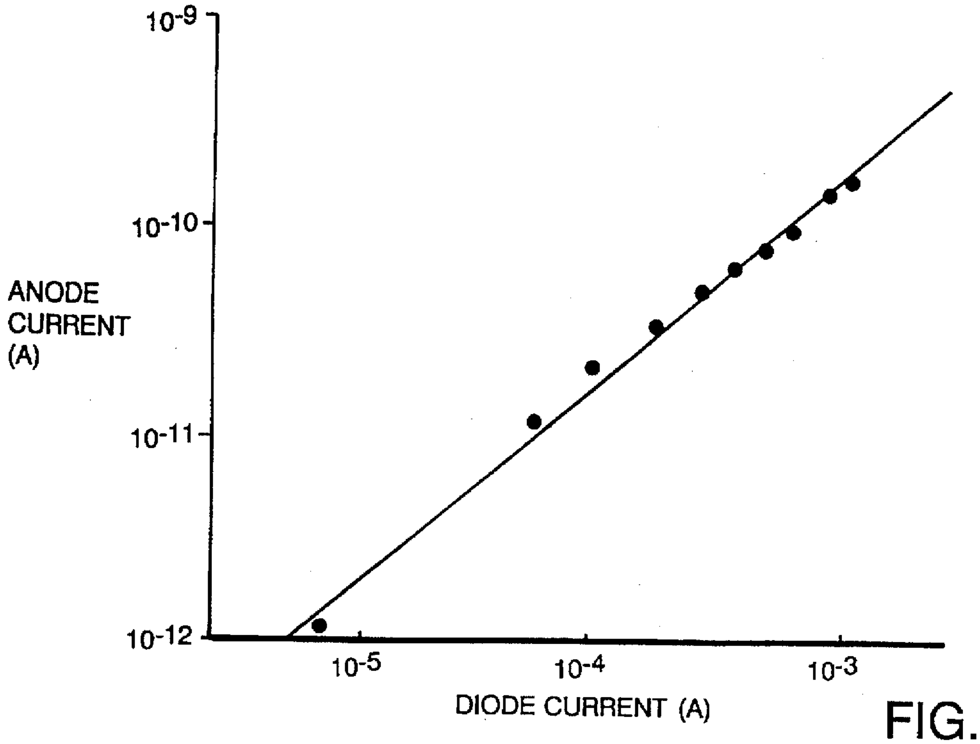
FIG. 3 depicts a graph of the anode current, $I_A$, as a function of the current to the aluminum contact, $I_D$, for the cold diamond cathode of FIG. 2.
Figure 4:
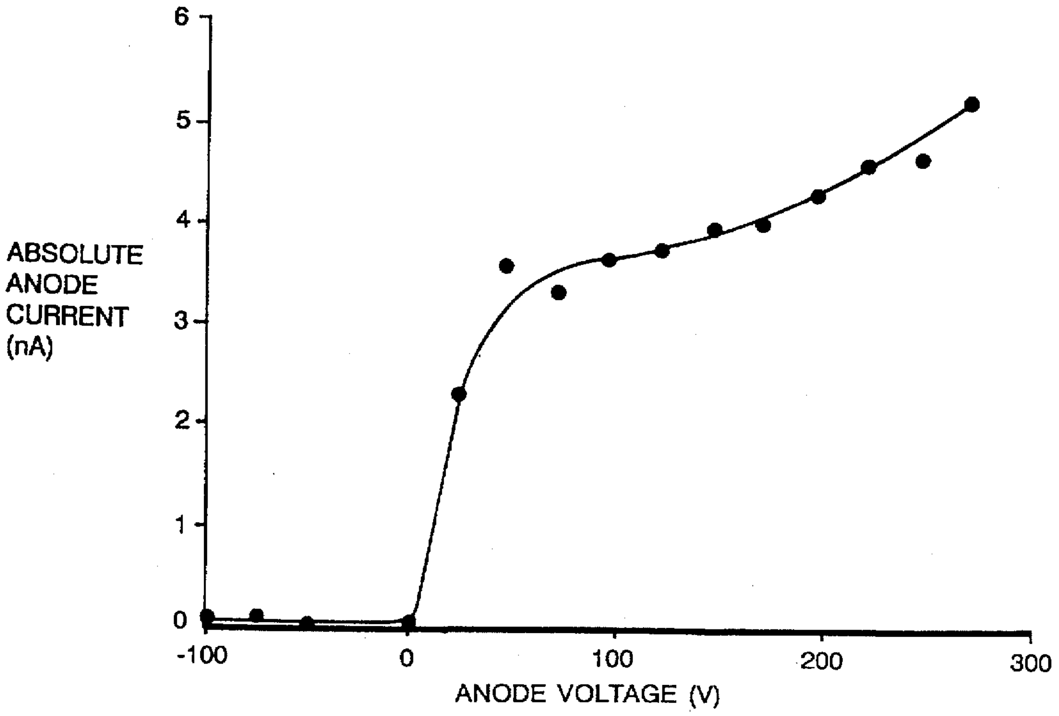
FIG. 4 depicts a graph of the anode current, $I_A$, as a function of the anode voltage $V_A$, for the cold diamond cathode of FIG. 2.

For measurements of emitted current, the mesa-etched diodes 10 are characterized in a turbopumped vacuum probing station with a base pressure of about $1\times10^{-5}$ Torr. The anode 60 consists of a stainless steel sheet coated with colloidal graphite and placed about a millimeter above the diamond cold cathode 10 under test. In initial experiments, the diode-substrate structures 10 were forward-biased to $V_D$=−100 to −200 V, most of which was dropped across the high resistance of the substrate 20. In later experiments, the $V_D$ was reduced to greater than about −100 V by heating the structure 10 to 100° C., which reduced the substrate 20 resistance by a factor of about 4. When a diamond cold cathode was forward biased, a negative current $I_A$ appeared on the anode 60, which varied with diode current $I_D$ as shown in FIG. 3, and with anode voltage $V_A$ as shown in FIG. 4. The anode current $I_A$ was usually noisy and decreased with time, becoming too low to measure ($<5\times10^{-13}$ A) after a few minutes. When the emitted current from one diode 10 was too small to measure, the other diodes still emitted. Cleaning the structures 10 in an oxygen plasma, and rinsing them in water and acetone caused all the diodes 10 to again emit. If $O_2$ is leaked into the probing station to about $1\times10^{-2}$ Torr, the emission current increases and no longer decreases with time. When the $O_2$ leak is turned off and the probing system returns to its base pressure, the emission current substantially increases but remains noisy. The addition of $H_2$ has little to no effect on emission current.

Several experiments were performed to determine important parameters for electron emission and to characterize carbon-implanted diodes, such as the diamond cold cathode 10 of FIG. 2.

Current emission was observed in all the diodes fabricated in (111)- and (100)-oriented diamond substrates, like 20 in FIG. 2, with acceptor densities on the order of $10^{16}$ $cm^{-3}$ (determined from capacitance measurements), and in chemical-vapor-deposited homoepitaxial diamond as described in the Geis paper with estimated boron concentrations of $10^{19}$ $cm^{-3}$.

Mesa-etched Al-diamond Schottky diodes, fabricated as described hereinabove but without carbon implantation, did not emit current when forward biased to the same voltage and current levels as the implanted diodes 10.

By varying the substrate temperature from 25° to 100° C. and keeping $I_D$ constant, $V_D$ could be varied from −200 to −100 V. To within experimental error, a factor of 3, $I_A$ is independent of $V_D$.

Diodes fabricated in insulating, type IIa diamond exhibited no forward or emitted currents when forward biased ($V_D$=−100 V).

Modified diodes were formed by etching 230 nm into the carbon-implanted substrate, removing the dark conductive layer formed during carbon implantation. Without the conductive layer, the 60×60 $\mu m^2$ Al squares formed diodes to the substrate and back-to-back diodes to each other. After the substrate was etched a second time to form mesas, as described hereinabove, the diodes exhibited diode current-voltage characteristics nearly identical to the unmodified diodes 10 and still emitted current when forward biased.

These results indicate that current flow through the diode produces current emission and that Al-diamond Schottky diodes with a barrier height of less than 2 eV do not emit electrons. The dark conductive layer formed during carbon implantation, which is similar to graphite according to Prins, "Electrical resistance of diamond implanted at liquid nitrogen temperature with carbon atoms," *Rad. Effects Lett.*, vol. 76, pp. 79–82, 1983, with a resistivity of about $8\times10^{-3}$ Ω cm and a temperature coefficient of $-4\times10^{-6}$ Ω cm °$C^{-1}$, is not required for current emission. The large forward voltage (about 2 V) required for the carbon-implanted diode to conduct, and the lack of substantial photoresponse for photon energies below 5.5 eV indicate that the carbon-implanted diodes are not Schottky in character and may be n-p junctions, as speculated by Prins, "Bipolar transistor action in ion implanted diamond," *Appl. Phys. Lett.*, vol. 41, pp. 950–952, 1982. The peak in the photoresponse for the carbon-implanted diode near 3.5 eV is believed to result from photoionization of traps. It is thought that when the diodes are forward biased, electrons are injected into the p-type diamond from the ion-damaged n-type region just below the dark conductive layer. Once the electrons are in the p-type semiconductor they can be emitted into vacuum. Similar models are used to explain cold cathode diodes (as described in Bell, *Negative Electron Affinity Devices*, Oxford: Clarendon Press, 1973, Chap. 8, pp. 96–109).

Thus, there has been formed cold cathodes in diamond by fabricating mesa-etched diodes using carbon ion implantation into p-type substrates. When these diodes are forward-biased, current is emitted into vacuum. The cathode efficiency (emitted current divided by diode current) in experimental models varies from $2\times10^{-4}$ to $1\times10^{-10}$ and increases with the addition of $O_2$ to the vacuum system. If a minority carrier lifetime less than 500 ps (as in Ho et al., "A diamond optoelectronic switch," *Optics Commun.*, vol. 46, pp. 202–204, 1983) and an electron mobility less than 1000 $cm^2$ $V^{-1}$ $s^{-1}$ are assumed, then the minority carrier diffusion length is less than 1 μm. If the emitting area is the perimeter of experimental diode (240 μm) times the minority carrier diffusion length, then the current density is estimated to be 0.1 to 1 A $cm^{-2}$ for an instrument-limited $I_D$=10 mA. This compares favorably with Si cold cathodes (not coated with Cs), which have cathode efficiencies of about 2×10−5 and current densities of about $2\times10^{-2}$ A $cm^{-2}$ (as in Ea et al., "Array silicon avalanche cathodes," *IEEE Electron Device Lett.*, vol. 1, pp. 403–405, 1990).

The invention has also been used to obtain electron emission from diamond (111) surface by ion implanting the diamond with carbon. The implantation was performed with the substrate at 320° C. using a 50 keV ion beam and a dose of $3.2\times10^{16}$ $cm^{-2}$ as described above.

When the sample was initially loaded into the vacuum chamber, there was no emission current from the diamond. However, by moving the anode which is usually about 1 mm above the diamond, on the diamond and passing current through the diamond-anode contact, there was emission when the anode was then moved to about a millimeter above the diamond sample. Addition of $O_2$(~1–$5\times10^{-2}$ Torr) to the chamber during emission did improve emission current. However, also adding moist air, by breathing on the diamond, resulted in a substantial increase in emitted current on the order of 1 mA $cm^{-2}$. After activation with both $O_2$ and $H_2O$ vapor, there was emission current with an anode voltage as low as 500 V. The electric field was believed to be on the order of $5\times10^3$ V $cm^{-1}$ for emission. The current increased with anode voltage showing a space-charge-like current increase with voltage in contrast with an exponential current increase with voltage usually found with conventional field emission cathodes.

It is believed that the electric field for electron emission may be further reduced by patterning the substrate to have a series of sharp points. These points have locally high electric fields causing emission; however, the average electric field is much lower.

Such points may be formed with an etching technique, such as ion beam assisted etching (IBAE), such as described in a paper of Efremow, Geis, Flanders, Lincoln and Economou entitled, "Ion-beam-assisted etching of diamond" in J.Vac. Sci. Technol. B 3(1), Jan./Feb. 1985, related to forming electrical devices in diamond incorporated herein by reference.

An important feature of the invention resides in obtaining electron emission with electric fields significantly smaller than $10^6$ V $cm^{-1}$.

Other embodiments are within the claims.

What is claimed is:

1. A cold cathode device comprising a wide-bandgap (>5 eV) material exhibiting negative electron affinities, low trap densities, and high carrier mobilities having a first region of n-type conductivity and a second region of p-type conductivity with a junction therebetween, and conductive contacts connected to said material for receiving a potential that forward biases said junction causing electrons to be emitted near said junction into an exterior region.

2. The device of claim 1 wherein said wide-bandgap material is diamond.

3. The device of claim 2 wherein said first region having n-type conductivity is carbon ion implanted diamond.

4. The device of claim 3 wherein said carbon ion implanted diamond is formed by carbon ion implantation into a diamond substrate heated to at least 320° C.

5. The device of claim 4 wherein said carbon ion implantation is effected using a carbon ion current density of about $10^{-5}$ A $cm^{-2}$, with ion energies in the range of about 50 keV to about 170 keV, and fluences in the range of about $3.0\times10^{16}$ $cm^{-2}$ to about $3.8\times10^{16}$ $cm^{-2}$.

6. The device of claim 2 wherein said second region having p-type conductivity is doped homoepitaxial diamond.

7. The device of claim 6 wherein said doped homoepitaxial diamond is formed by chemical vapor deposition with boron concentrations up to $10^{19}$ $cm^{-3}$.

8. The device of claim 6 wherein said second region is less than about 1 μm thick.

9. The device of claim 1 wherein at least one of said conductive contacts is formed from aluminum.

10. The device of claim 1 wherein a surface area of said second region exposed to said exterior region is substantially equal to the area of said junction between said first region and said second region.

11. The device of claim 1 wherein said exterior region includes less than about $1\times10^{-2}$ Torr of $O_2$.

12. The device of claim 1 wherein said exterior region is characterized by an ultrahigh-vacuum of less than about $1\times10^{-5}$ Torr.

13. A cold cathode device in accordance with claim 1 wherein said first region comprises diamond, and further comprising a source of an electric potential connected to said conductive contacts establishing an electric field across said junction of less than $10^6$ V $cm^{-1}$.

14. The device of claim 13 wherein said wide-bandgap material is formed with sharp points.

15. A cold cathode device in accordance with claim 14 wherein said sharp points are formed by ion-beam-assisted etching.

16. A cold cathode device in accordance with claim 2 and further comprising an emitting surface near said junction that is (111)-orientation of diamond.

17. A cold cathode device in accordance with claim 2 wherein said first region is formed with phosphorous doping.

18. A cold cathode device consisting of a large band gap material n-type, semiconductor with a forward-biased junction from which semiconductor electrons are emitted by an electric field of less than $10^6$ V $cm^{-1}$ in the space above the semiconductor surface.

19. A cold cathode device in accordance with claim 18 where the semiconductor is diamond.

20. A cold cathode device in accordance with claim 18 where the semiconductor is diamond doped n-type with phosphorus.

21. A cold cathode device in accordance with claim 18 where the semiconductor is diamond doped n-type by radiation damage in the crystal.

22. A cold cathode device in accordance with claim 18 where the semiconductor is diamond doped n-type by ion implantation.

23. A cold cathode device in accordance with claim 22 where the n-type doping is obtained with carbon ion implantation while the diamond is heated.

24. A cold-cathode device in accordance with claim 1 and further comprising, a source of a potential connected to said conductive contacts forward-biasing said junction.

* * * * *

UNITED STATES PATENT AND TRADEMARK OFFICE

CERTIFICATE OF CORRECTION

PATENT NO. : 5,670,788

DATED : September 23, 1997

INVENTOR(S) : Michael W. Geis

Column 1:

The first paragraph should read: --This invention was made with government support under Contract Number F19628-90-C-0002 awarded by the Department of the Air Force. The government has certain rights in the invention.--

Signed and Sealed this

Twenty-fourth Day of March, 1998

Attest:

BRUCE LEHMAN

*Attesting Officer*

*Commissioner of Patents and Trademarks*